(12) United States Patent
Birrittella

(10) Patent No.: US 6,992,515 B1
(45) Date of Patent: Jan. 31, 2006

(54) CLOCK SIGNAL DUTY CYCLE ADJUST CIRCUIT

(75) Inventor: Mark S. Birrittella, Chippewa Falls, WI (US)

(73) Assignee: Cray, Inc., Seattle, WA (US)

( * ) Notice: Subject to any disclaimer, the term of this patent is extended or adjusted under 35 U.S.C. 154(b) by 0 days.

(21) Appl. No.: 10/643,576

(22) Filed: Aug. 18, 2003

(51) Int. Cl.
 *H03K 3/17* (2006.01)

(52) U.S. Cl. .................... 327/175; 327/176; 327/36

(58) Field of Classification Search .............. 327/31, 327/35, 36, 172–176
See application file for complete search history.

(56) References Cited

U.S. PATENT DOCUMENTS

| | | | | |
|---|---|---|---|---|
| 4,972,160 A | | 11/1990 | Sylvain | 331/1 A |
| 5,027,085 A | | 6/1991 | DeVito | 331/1 A |
| 5,440,274 A | | 8/1995 | Bayer | 331/1 A |
| 5,638,016 A | * | 6/1997 | Eitrheim | 327/175 |
| 5,757,218 A | | 5/1998 | Blum | 327/175 |
| 5,912,574 A | | 6/1999 | Bhagwan | 327/157 |
| 5,940,608 A | | 8/1999 | Manning | 395/558 |
| 6,040,726 A | * | 3/2000 | Martin | 327/175 |
| 6,100,736 A | * | 8/2000 | Wu et al. | 327/159 |
| 6,285,226 B1 | | 9/2001 | Nguyen | 327/175 |
| 6,307,411 B1 | | 10/2001 | Kerner | 327/156 |
| 6,340,904 B1 | | 1/2002 | Manning | 327/156 |
| 6,342,801 B1 | | 1/2002 | Shin | 327/175 |
| 6,373,309 B1 | | 4/2002 | Bang | 327/175 |
| 6,384,652 B1 | | 5/2002 | Shu | 327/175 |
| 6,426,660 B1 | | 7/2002 | Ho et al. | 327/175 |
| 6,677,792 B2 | * | 1/2004 | Kwak | 327/158 |
| 6,768,361 B2 | * | 7/2004 | Kwak | 327/158 |

\* cited by examiner

*Primary Examiner*—My-Trang Nu Ton
*Assistant Examiner*—An T. Luu
(74) *Attorney, Agent, or Firm*—Schwegman, Lundberg, Woessner & Kluth, P.A.

(57) ABSTRACT

Systems and methods for independently adjusting a duty cycle of an input clock signal in an IC to compensate for uncertainties and distortions in the logic signals resulting from the logic signals propagating through the IC to improve system performance. This is accomplished by inputting first and second programming instructions into one of a plurality of edge-triggered circuits to select one of a series of plurality of incremental or decremental duty cycle adjust circuits to adjust the duty cycle of a clock signal as a function of the first and second programming instructions.

38 Claims, 3 Drawing Sheets

CLOCK SIGNAL DUTY CYCLE ADJUST CIRCUIT

FIELD OF THE INVENTION

The present invention relates generally to an integrated circuit (IC), and more particularly, to a clock signal duty cycle adjust circuit and method for an IC.

BACKGROUND INFORMATION

Clock signals are used in virtually every IC and electronic system to control timing. For example, every time there is a rising edge on a clock signal, all the edge-triggered circuits, such as flip-flops, latches, and so on in an IC may change state. Frequently, both edges, rising and falling, of a clock signal are used in an IC and an electronic system. For example, in a two-phase logic, data is read into a first edge-triggered circuit on one edge of the clock signal, for example, during a falling edge, and a logic function is performed on the read data during the low phase. The data then appears at a second edge-triggered circuit and is outputted on the other edge of the clock signal, for example, during a rising edge, and another logic function is performed on the outputted data during a high phase. The data then appears at a third edge-triggered circuit and is outputted on the next edge of the clock cycle, for example, during a falling edge. Such functions are sometimes referred to as a combinational logic, where the logic functions in an IC are performed during both low and high phases of a clock cycle. Such edge-triggered circuits are generally edge sensitive.

The clock generator in an electronic system initially determines duty cycle of a clock signal. The duty cycle refers to a percentage of time a clock signal is "high" versus "low". Clock generators are typically set to generate clock signals having a 50% duty cycle. As logic signals propagate through an Integrated circuit (IC), they can become distorted and a combinational logic function, such as the one described-above, can require a longer or shorter state than the initially set 50% duty cycle, to evaluate its function in a clock cycle. The distortion can result in uncertainty and a delay in logic signals which can result in a logic function requiring a longer or shorter percentage of time a clock signal to stay high or low during a clock cycle to improve system performance.

For the reasons stated above, and for reasons stated below which will become apparent to those skilled in the art upon reading and understanding the present specification, there is a need in the art for independently adjusting the duty cycle of a clock signal in an IC to compensate for any resulting uncertainty in the delay of the logic signals while propagating through an IC to improve system performance.

SUMMARY OF THE INVENTION

The above-mentioned shortcomings, disadvantages and problems are addressed by the present invention, which will be understood by reading and studying the following specification.

In one aspect of the present invention, a system and method is described for independently adjusting duty cycle of an input clock signal in an integrated circuit (IC) to compensate for any resulting uncertainties and delay in the logic signals due to the logic signals propagating through the IC to improve system performance. This is accomplished by inputting a first programmed instruction for selecting one of a plurality of predetermined incrementing or decrementing separations between a raising edge and a falling edge of an inputted clock signal into an IC. A first control signal or a second control signal is then outputted as a function of the first programmed instruction. One of a plurality of incremented or decremented duty cycle adjusted clock signals are then generated by incrementing or decrementing separation between the raising edge and the falling edge of the input clock signal as a function of the first control signal. A second programmed instruction is then inputted for selecting to output the generated one of the plurality of incremented or decremented duty cycle adjusted clock signals. A third control signal or a fourth control signal is then outputted as a function of the second programmed instruction. One of the generated plurality of incremented or decremented duty cycle adjusted clock signals is then selected as a function of the third control signal or the fourth control signal. One of the selected plurality of incremented or decremented duty cycle adjusted clock signals is then outputted to provide the desired duty cycle adjusted clock signal.

Another aspect of the present invention provides a duty cycle adjust circuit for adjusting duty cycle of an input clock signal into an IC, includes a first programmable logic circuit, a second programmable logic circuit, a positive variable duty cycle adjust circuit, a negative variable duty cycle adjust circuit, and an output module. The first programmable logic circuit outputs one of a plurality of variable incremental or decremental high logic signals upon receiving a first control signal or a second control signal, respectively. The first and second control signals are based on one of a predetermined amount of incremental or decremental high signals from a high signal of an input clock signal. The second programmable logic circuit outputs an incremented high logic signal upon receiving a third control signal or outputs a decremented high logic signal upon receiving a fourth control signal. The positive duty cycle adjust circuit receives the input clock signal and the first control signal and outputs one of a plurality of predetermined incremented duty cycle clock signals having an incremented high signal from the high signal of the input clock signal as a function of the first control signal. The negative duty cycle adjust circuit receives the input clock signal and the second control signal and outputs one of a plurality of predetermined decremented duty cycle clock signals having a decremented high signal from the high signal of the input clock signal as a function of the second control signal. The output module then receives the third control signal or the fourth control signal from the second programmable logic circuit and outputs an adjusted clock signal having one of a plurality of predetermined incremented or decremented duty cycle clock signals as a function of the received third or fourth control signals, respectively.

Yet another aspect of the present invention provides a circuit for adjusting duty cycle of an input clock signal into an IC, includes a first edge-triggered circuit, a second edge-triggered circuit, a positive variable duty cycle adjust circuit, a negative variable duty cycle adjust circuit, and an output module. The first edge-triggered circuit receives a first control signal or a second control signal based on one of a plurality of predetermined amount of incremental or decremental separations between a raising edge and a falling edge of an input clock signal and outputs one of a plurality of variable incremental or decremental high logic signals, respectively. The second edge-triggered circuit outputs an incremented high logic signal or a decremented high logic signal upon receiving a third control signal or a fourth control signal, respectively. The positive variable duty cycle adjust circuit receives an input clock signal and one of the plurality of variable incremental high logic signals and outputs an incremented duty cycle adjusted clock signal having one of the plurality of predetermined amount of incremental separations between the raising edge and the falling edge of the input clock signal as a function of the received one of the plurality of variable incremental high logic signals. The negative variable duty cycle adjust circuit receives the input clock signal and one of the plurality of variable decremental high logic signals and outputs a decremented duty cycle adjusted clock signal having one of the plurality of predetermined amount of decremental separations between the raising edge and the falling edge of the input clock signal as a function of the received one of the plurality of variable decremental high logic signals. The output module receives the incremented or decremented high logic signals and outputs an adjusted clock signal having the incremented duty cycle adjusted clock signal or the decremented duty cycle adjusted clock signal as a function of the received incremented high logic signal or the decremented high logic signal, respectively.

The present invention describes systems and methods of varying scope. In addition to the aspects and advantages of the present invention described in this summary, further aspects and advantages of the invention will become apparent by reference to the drawings and by reading the detailed description that follows.

DETAILED DESCRIPTION OF THE INVENTION

The following description is directed towards a duty cycle adjust circuit for independently adjusting a duty cycle of a clock signal in an IC to compensate for uncertainty and distortions in the logic signals propagating through the IC to improve system performance.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical, and electrical changes may be made without departing from the spirit and scope of the present invention. The following detailed description is, therefore, not to be taken in a limiting sense, and the scope of the present invention is defined only by the claims.

Figure 1:
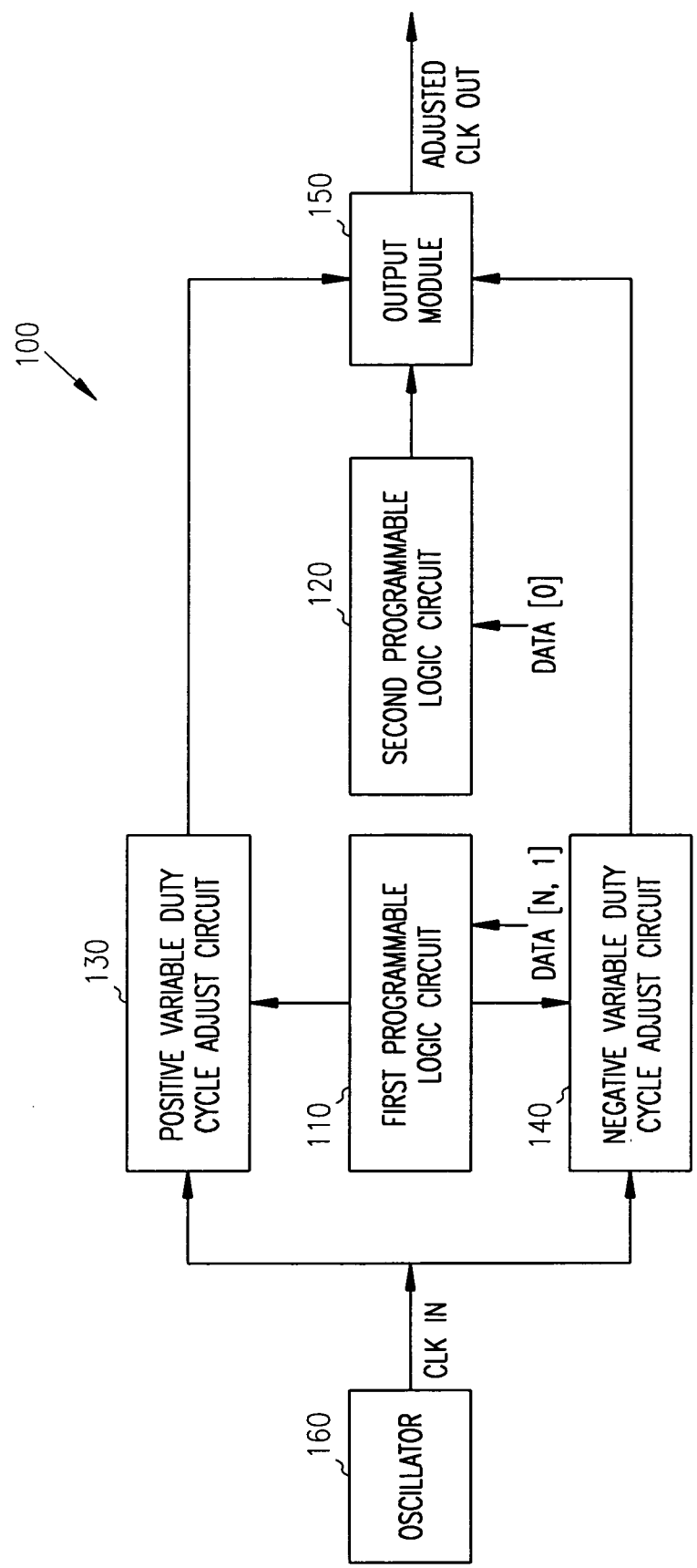
FIG. 1 is a block diagram illustrating one embodiment of a duty cycle adjust circuit according to the present invention.

FIG. 1 shows a representative duty cycle adjust circuit. FIG. 1 illustrates an example of a duty cycle adjust circuit 100 including a first programmable logic circuit 110 and a second programmable logic circuit 120. As shown in FIG. 1, the duty cycle adjust circuit 100 further includes a positive variable duty cycle adjust circuit 130 and a negative variable duty cycle adjust circuit 140. In addition, the duty cycle adjust circuit 100 shown in FIG. 1 includes an output module 150 and an oscillator 160. The terms 'first and second programmable logic circuits' and 'first and second edge-triggered circuits' are interchangeably used throughout this document. The first and second programmable logic circuits 110 and 120 and positive and negative variable duty cycle adjust circuits 130 and 140 can be based on edge-triggered flip flop circuits, NAND gate circuits, and/or any other edge sensitive circuits.

In operation, oscillator 160 generates an input clock signal having high and low singles. Input clock signal can be a pulse type waveform. In some embodiments, oscillator 160 generates the input clock signal having a pulse type waveform that includes first and second edges in each clock cycle. In these embodiments, the first and second edges are rising and falling edges having high and low signals, respectively. The high and low signals can be less than one half the clock cycle. Also in these embodiments, the clock signals are logic signals that switch from low to high and then from high to low with a fixed repetition pattern in time.

Input clock signal from the oscillator 160 then drives the positive and negative variable duty cycle adjust circuits 130 and 140. The first programmable logic circuit 110 receives a first control signal or a second control signal based on desired one of a predetermined amount of incremental high signals from a high signal of the input clock signal or one of a predetermined amount of decremental high signals from a high signal of the input clock signal and outputs one of a plurality of associated variable incremental or decremental high signals, respectively.

In some embodiments, the first and second control signals are based on receiving a first and second programmed instructions, which is based on the desired one of the predetermined amount of incremental high signals from the high signal of the input clock signal or the decremental high signals from the high signal of the input clock signal, respectively. In other embodiments, a first edge circuit receives the first control or a second control signal based on one of a plurality of predetermined amount of incremental or decremental separations between a raising edge and a falling edge of an input clock signal and outputs one of the plurality of variable incremental or decremental high logic signals, respectively.

The second programmable logic circuit 120 receives a third control signal or a fourth control signal based on a desired incremented duty cycle adjust clock signal or a decremented duty cycle adjusted clock signal, respectively. In these embodiments, the third and the fourth control signals are based on receiving a second programmed instruction that is based on the desired incremented duty cycle adjusted clock signal or the decremented duty cycle adjusted clock signal, respectively. The second programmable logic circuit 120 outputs an incremented high logic signal or a decremented high logic signal upon receiving the third control signal or the fourth control signal, respectively. In some embodiments, a second edge-triggered circuit outputs the incremented high logic signal or the decremented high logic signal upon receiving the third control signal or the fourth control signal, respectively.

The positive variable duty cycle adjust circuit 130 receives the input clock signal from the oscillator 160 and the first control signal from the first programmable logic circuit 110. The positive variable duty cycle adjust circuit 130 then outputs one of a plurality of incremented duty cycle clock signals having an incremented high signal from the high signal of the input clock signal as a function of the received first control signal. In some embodiments, the positive variable duty cycle adjust circuit 130 receives the input clock signal from the oscillator 160 and the one of the plurality of variable incremental high logic signals as a function of the first control signal from the first programmable logic circuit 110. The positive variable duty cycle adjust circuit 130 then outputs an incremented duty cycle adjusted clock signal having one of a plurality of predetermined amount of incremental separations between the raising edge and the falling edge of the input clock signal as function of the one of the plurality of variable incremental high logic signals.

The negative variable duty cycle adjust circuit 140 receives the input clock signal from the oscillator 160 and the second control signal from the first programmable logic circuit 110. The negative variable duty cycle adjust circuit 140 then outputs one of a plurality of decremented duty cycle clock signals having a decremented high signal from the high signal of the input clock signal as a function of the received second control signal. In some embodiments, the negative variable duty cycle adjust circuit 140 receives the input clock signal from the oscillator 160 and the one of the plurality of variable decremental high logic signals as a function of the second control signal from the first programmable logic circuit 110. The negative variable duty cycle adjust circuit 140 then outputs a decremented duty cycle adjusted clock signal having one of a plurality of predetermined amount of decremental separations between the raising edge and the falling edge of the input clock signal as function of the one of the plurality of variable decremental high logic signals.

The output module 150 receives the incremented high logic signal or the decremented high logic signal from the second programmable logic circuit 120 and the incremented or decremented duty cycle adjusted clock signals from the positive and negative variable duty cycle adjust circuits 130 and 140, respectively. The output module 150 then outputs one of the plurality of adjusted clock signals having one of the plurality of incremented duty cycle clock signals or one of the plurality of decremented duty cycle clock signals as a function of the received incremented high logic signal or the decremented high logic signal, respectively.

Figure 2:
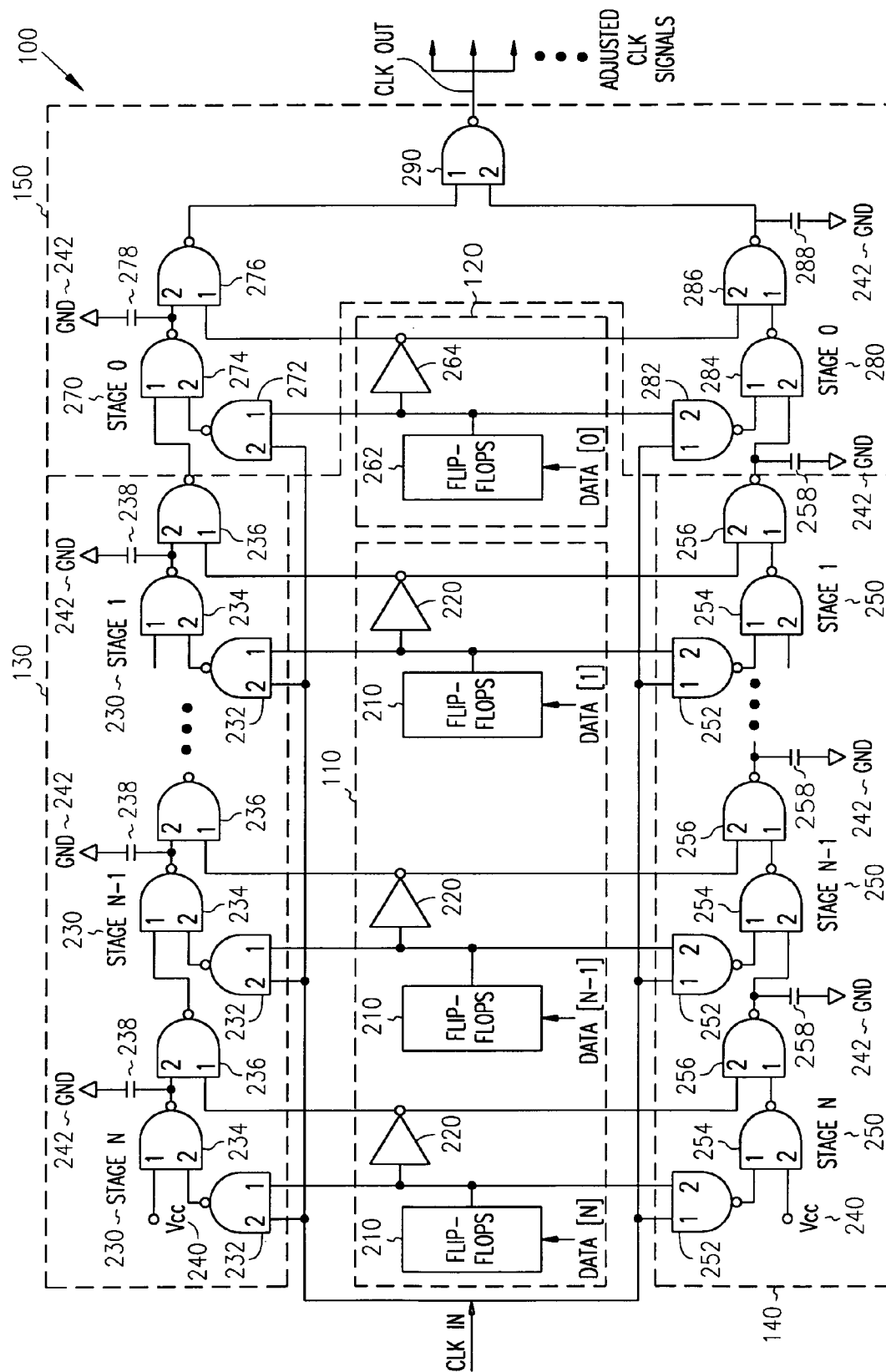
FIG. 2 is a circuit diagram illustrating one embodiment of the duty cycle adjust circuit shown in FIG. 1.

FIG. 2 is a circuit diagram of the duty cycle adjust circuit 100 according to an embodiment of the present invention. The duty cycle adjust circuit 100 shown in FIG. 2 includes the first programmable logic circuit 110, the second programmable logic circuit 120, the positive variable duty cycle adjust circuit 130, the negative variable duty cycle adjust circuit 140, the output module 150, and an oscillator 160.

The first programmable logic circuit 110 comprises a plurality of memory elements 210 associated with the predetermined amount of incremental and decremental high signals of the positive and negative variable duty cycle adjust circuits 130 and 140. Each of the plurality of memory elements 210 has an input to receive the first control signal. In some embodiments, input of each plurality of memory elements 210 receives a first programmed instruction. In some embodiments, memory elements 210 can be registers, flip-flop circuits and the like.

As shown in FIG. 2, the first programmable logic circuit 110 further includes a plurality of inverters 220 associated with each of the memory elements 210. Each of the inverters 220 has an input and an output. The input of each inverter 220 is coupled to output of each memory element 210. The output of each inverter 220 is coupled to an associated predetermined amount of incremental and decremental high signals of the positive and negative variable duty cycle adjust circuits 130 and 140.

The positive variable duty cycle adjust circuit 130 includes a plurality of duty cycle incremental adjust circuits 230, labeled "Stage'N', Stage'N–1', . . . Stage'1',", associated with the plurality of incremental high signals. In the embodiment shown, each of the incremental adjust circuit 230 includes a plurality of NAND gates. In some embodiments, each incremental adjust circuit includes multiple NAND gates. Each of the plurality of NAND gates includes a first NAND gate 232, a second NAND gate 234, and a third NAND gate 236. The first NAND gate 232 has first and second inputs and an output. The first input of the first NAND gate 232 is coupled to the output of the associated memory element 210 and the input of the associated inverter 220 of the first programmable logic circuit 110. The second input of the first NAND gate 232 is coupled to a CLK IN.

The second NAND gate 234 has first and second inputs and an output. The first input of the second NAND gate 234 is coupled to a power source $V_{cc}$ 240 for Stage N and to the output of the previous stage's NAND gate 236 for each other stage. The second input of the second NAND gate 234 is coupled to the output of the first NAND gate 232.

The third NAND gate 236 has first and second inputs and an output. The first input of the third NAND gate 236 is coupled to the output of the associated inverter 220 of the first programmable logic circuit 110. The second input of the third NAND gate 236 is coupled to the output of the second NAND gate 234. The output of the third NAND gate 236 is coupled to a first input of a second NAND gate 234 of a subsequent plurality of the NAND gates of the plurality of duty cycle incremental adjust circuits 230.

As shown in FIG. 2, the duty cycle incremental adjust circuit 230 of the positive variable duty cycle adjust circuit 130 further includes a capacitor 238. The capacitor 238 is coupled to the plurality of NAND gates of duty cycle incremental adjust circuit 230 such that one end of the capacitor 238 is coupled between an output of the second NAND gate 234 and the second input of the third NAND gate 236 and the other end of the capacitor 238 is connected to ground (GND) 242.

Referring to FIG. 2, the negative variable duty cycle adjust circuit 140 includes a plurality of duty cycle decremental adjust circuits 250, labeled "Stage 'N', Stage'N–1', . . . Stage'1',", associated with the plurality of predetermined amount of decremental high signals. Each duty cycle decremental adjust circuit 250 includes a plurality of NAND gates. In some embodiments, plurality of NAND gates includes multiple NAND gates.

Each of the plurality of NAND gates includes a first NAND gate 252, a second NAND gate 254, and a third NAND gate 256. The first NAND gate 252 has first and second inputs and an output. The first input of the first NAND gate 252 is coupled to the CLK IN. The second input of the first NAND gate 252 is coupled to the output of the associated memory element 210 and the input of the associated inverter 220 of the first programmable logic circuit 110.

The second NAND gate 234 has first and second inputs and an output. The first input of the second NAND gate 254 is coupled to the output of the first NAND gate 252. The second input of the second NAND gate 254 is coupled to the power source $V_{cc}$ 240.

The third NAND gate 256 has first and second inputs and an output. The first input of the third NAND gate 256 is coupled to the output of the second NAND gate 254. The second input of the third NAND gate 256 is coupled to the output of the associated inverter 220 of second programmable logic circuit 110. The output of the third NAND gate 256 is coupled to a second input of a second NAND gate 254 of a subsequent plurality of NAND gates of the duty cycle decremental adjust circuit 250.

As shown in FIG. 2, the duty cycle decremental adjust circuit 250 of the negative variable duty cycle adjust circuit 140 further includes a capacitor 258. The capacitor 258 is coupled to the plurality of NAND gates of duty cycle decremental adjust circuit 250 such that one end of the capacitor 258 is coupled between an output of the third NAND gate 256 and the second input of the second NAND gate 254 of the subsequent duty cycle decremental adjust circuit 250 and the other end of the capacitor 258 is connected to ground (GND) 242.

Referring to FIG. 2, second programmable logic circuit 120 includes a memory element 262 and an associated inverter 264. The memory element 262, for example, can be a register, flip-flop circuit, and the like. The memory element 262 has an input and an output. The input of the memory element 262 receives the second control signal. The inverter 264 has an input and an output. The input of the inverter 264 is coupled to the output of the memory element 264. The inverter 264 outputs the incremented high logic signal or the decremented high logic signal as a function of the received second control signal.

As shown in FIG. 2, output module 150 includes a duty cycle incremental select circuit 270 and an associated duty cycle decremental select circuit 280, labeled "Stage '0'". The duty cycle incremental select circuit 270 includes a plurality of NAND gates.

The plurality of NAND gates of the duty cycle incremental select circuit 270 includes a first NAND gate 272, a second NAND gate 274, and a third NAND gate 276. The first NAND gate 272 has first and second inputs and an output. The first input of the first NAND gate 272 is coupled to the input of the inverter 264 and the output of the memory element 262 of the output module 150. The second input of the first NAND gate 272 is coupled to CLK IN to receive an input clock signal from an oscillator 160.

The second NAND gate 274 has first and second inputs and an output. The first input of the second NAND gate 274 is coupled to the output of a third NAND gate of a precedent duty cycle incremental select circuit. The second input of the second NAND gate 274 is coupled to the output of the first NAND gate 272.

The third NAND gate 276 has first and second inputs and an output. The first input of the third NAND gate 276 is coupled to the output of the inverter 264 of the output module 150. The second input of the third NAND gate 276 is coupled to the output of the second NAND gate 274. The output of the third NAND gate 276 is coupled to the output module 290.

Referring now to FIG. 2, the duty cycle incremental select circuit further includes a capacitor 278. The capacitor 278 is coupled between the output of the second NAND gate 274 and the second input of the third NAND gate 276 of the output module 150.

As shown in FIG. 2, the plurality of NAND gates of the associated duty cycle decremental select circuit 280 includes a first NAND gate 282, a second NAND gate 284, and a third NAND gate 286. The first NAND gate 282 has first and second inputs and an output. The fist input of the first NAND gate 282 is coupled to CLK IN. The second input of the first NAND gate 282 is coupled to the output of the memory element 262 and input of the inverter 264 of the second programmable logic circuit 120.

The second NAND gate 284 has first and second inputs and an output. The first input of the second NAND gate 284 is coupled to the output of the first NAND gate 282. The second input of the second NAND gate 284 is coupled to the output of a third NAND gate 286 of a precedent plurality of NAND gates of the duty cycle decremental select circuit 280.

The third NAND gate 286 has first and second inputs and an output. The first input of the third NAND gate 286 is coupled to the output of the second NAND gate 284. The second input of the third NAND gate 286 is coupled to the output of the inverter 264 of the second programmable logic circuit 120. The output of the third NAND gate 286 is coupled to the output module 290.

Referring now to FIG. 2, the duty cycle decremental select circuit 280 further includes a capacitor 288. One end of the capacitor 288 is coupled to the output of the third NAND gate 286 and the other end of the capacitor 288 is coupled to the GND 242.

As shown in FIG. 2, the output module 150 further includes a NAND gate 290. The NAND gate 290 of the output module 150 comprises first and second inputs and an output. The first input of the NAND gate 290 is coupled to the output of the third NAND gate 276 of the duty cycle incremental select circuit 270. The second input of the NAND gate 290 is coupled to the output of the third NAND gate 286 of the duty cycle decremental select circuit 280 and the capacitor 288. The output of the NAND gate 290 is coupled to a CLK OUT.

In some embodiments, NAND gate 290 is an adjusted clock signal NAND gate. Adjusted clock signal NAND gate has first and second inputs and an output. In these embodiments, the output of the third NAND gate 276 of the output module 150 is coupled to a first input of the adjusted clock signal NAND gate 290. Further, the output of the third NAND gate 286 of the output module 150 is couple to the second input of the adjusted clock signal NAND gate 290. The output of the adjusted clock signal NAND gate is coupled to the CLK OUT.

Figure 3:
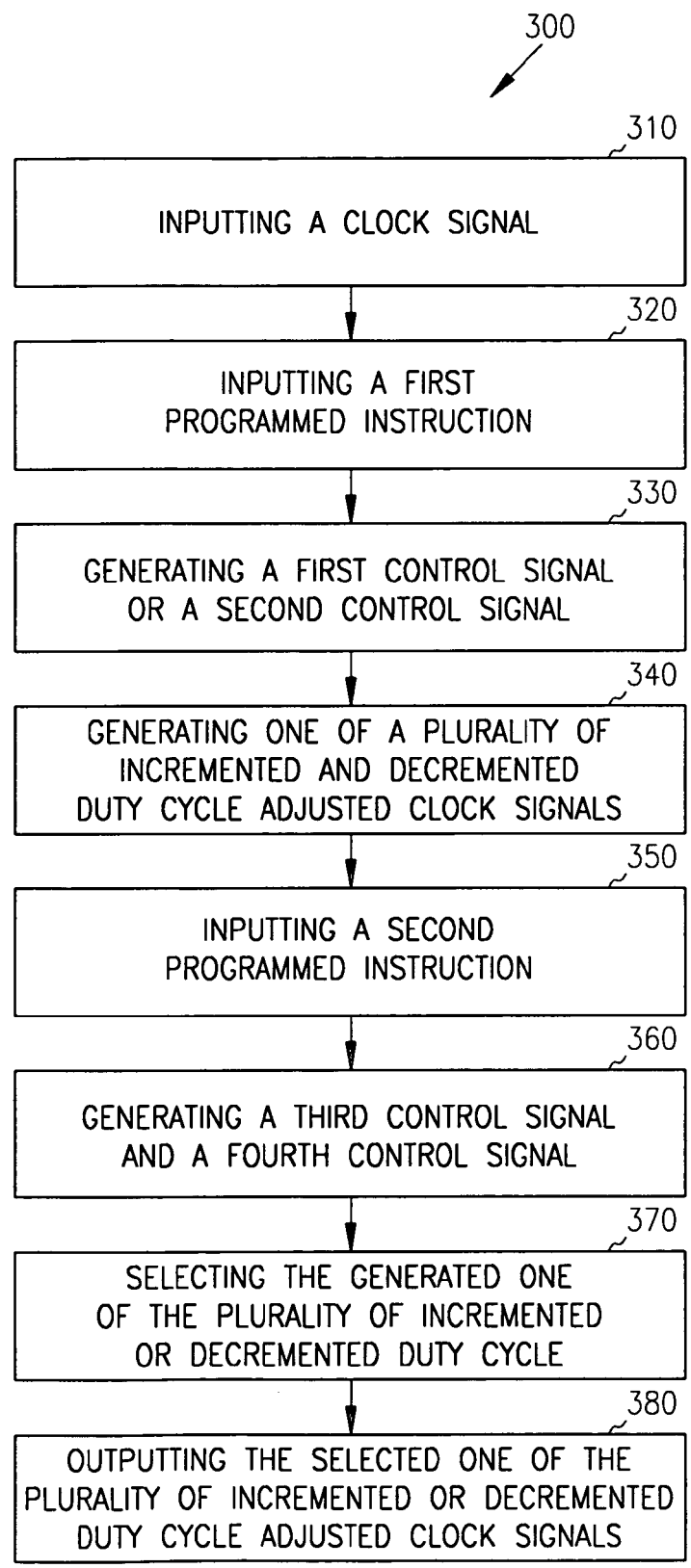
FIG. 3 is a flowchart of a method illustrating one example embodiment of synchronizing the system clock signal to the reference clock signal according to the present invention.

FIG. 3 is a flowchart 300 of one exemplary method of adjusting duty cycle of an input clock signal in an integrated circuit (IC), according to the present invention. Flowchart 300 includes operations 310–380, which are arranged serially in the exemplary embodiment. However, other embodiments of the subject matter may execute two or more operations in parallel, using multiple processors or a single processor organized as two or more virtual machines or sub-processors. Moreover, still other embodiments implement the operations as two or more specific interconnected hardware modules with related control and data signals communicated between and through the modules, or as portions of an application-specific integrated circuit. Thus, the exemplary process flow is applicable to software, firmware, and hardware implementations.

As shown in FIG. 3, operation 310 includes generating and inputting a clock signal. In these embodiments, input clock signal is generated using an oscillator. Also in these embodiments, the oscillator generates the input clock signal having a 50% duty cycle.

In some embodiments, the input clock signal has high and low singles. Input clock signal can be a pulse type waveform. In some embodiments, the input clock signal is a pulse type waveform that includes first and second edges in each clock cycle. In these embodiments, the first and second edges are rising and falling edges having high and low signals, respectively. The high and low signals can be less than one half the clock cycle. Also in these embodiments, the clock signals are logic signals that switch from low to high and then from high to low with a fixed repetition pattern in time.

Operation 320 includes inputting a first programmed instruction for selecting one of a plurality of incrementing or decrementing separations between the raising edge and the falling edge of the inputted clock signal into the integrated circuit device. In some embodiments, inputting the first programmed instruction includes storing the first programmed instruction in an associated memory element. In these embodiments, memory elements can comprise devices, such as registers, flip-flop circuits, and so on.

Operation 330 includes generating a first control signal or a second control signal as a function of the first programmed instruction. Operation 340 includes generating one of a plurality of incremented or decremented duty cycle adjusted clock signals by incrementing or decrementing separation between the raising edge and the falling edge of the inputted clock signal as a function of the first control signal.

Operation 350 includes inputting a second programmed instruction for selecting to output the generated one of the plurality of incremented or decremented duty cycle adjusted clock signals. In some embodiments, inputting the second programmed instruction includes storing the second programmed instruction in an associated memory element. In these embodiments, memory elements can comprise devices, such as registers, flip-flop circuits, and so on.

Operation 360 includes generating a third control signal or a fourth control signal as a function of the second programmed instruction. Operation 370 includes selecting the generated one of the plurality of incremented or decremented duty cycle adjusted clock signals as a function of the third control signal or the fourth control signal.

Operation 380 including outputting the selected one of the plurality of incremented or decremented duty cycle adjusted clock signals. In some embodiments, the outputting of the selected one of the plurality of incremented or decremented duty cycle adjusted clock signals further include multiplexing the outputted incremented or decremented duty adjusted clock signal.

CONCLUSION

Systems, methods, and apparatus for independently adjusting duty cycle of a clock signal in an IC to compensate for any resulting uncertainty in the delay of the logic signals due to the logic signals propagating through the IC to improve system performance. Although specific embodiments have been illustrated and described herein, it will be appreciated by those skill in the art that any arrangement, which is calculated to achieve the same purpose may be substituted for the specific embodiments shown. This application is intended to cover any adaptations or variations of the present invention.

In particular, one of skill in the art will readily appreciate that the names of the methods and apparatus are not intended to limit embodiments of the invention. Furthermore, additional methods and apparatus can be added to the components to correspond to future enhancements and physical devices used in embodiments of the invention can be introduced without departing from the scope of embodiments of the invention. One of skill in the art will readily recognize that embodiments of the invention are applicable to future integrated circuits used in adjusting duty cycle of an input clock signal.

What is claimed is:

1. A duty cycle adjust circuit comprising:
   a first programmable logic circuit to output a plurality of variable incremental high logic signals, the incremental logic signals to increment edges of a high signal of an input clock signal in accordance with a set of first control signals, and to output a plurality of variable decremental high logic signals, the decremental logic signals to decrement edges of the high signal of the input clock signal in accordance with the first control signals;
   a second programmable logic circuit to output an incremented high logic signal or to output a decremented high logic signal upon receiving a second control signal;
   a positive variable duty cycle adjust circuit to couple to an input clock terminal (CLK IN) to receive the input clock signal and the incremental high logic signals and to output an incremented duty cycle adjusted clock signal, the clock signal having a high signal incremented from the high signal of the input clock signal as a function of the first control signals;
   a negative variable duty cycle adjust circuit to couple to couple to the CLK IN to receive the input clock signal and the decremental high logic signals and to output a decremented duty cycle adjusted clock signal, the clock signal having a high signal decremented from the high signal of the input clock signal as a function of the first control signals; and
   an output module to receive the incremented and decremented high logic signals and the incremented and decremented duty cycle adjusted clock signals, and to couple to an output clock terminal (CLK OUT) to output an adjusted clock signal having an incremented or decremented duty cycle clock signal as a function of the second control signal.

2. The circuit of claim 1, further comprising:
   an oscillator coupled to the CLK IN to generate the input clock signal having the high signal and a low signal within a clock cycle.

3. The circuit of claim 1, wherein the first programmable logic circuit comprises:
   a plurality of memory elements associated with the incremental and decremental high logic signals, wherein each memory element has an input and an output, each input to couple to receive an associated first control signal; and
   a plurality of inverters, wherein each inverter has an input and an output, wherein the input of each inverter is coupled to the output of an associated memory element, wherein the output of the inverter is coupled to the positive variable duty cycle adjust circuit and the negative variable duty cycle adjust circuit.

4. The circuit of claim 3, wherein the positive variable duty cycle adjust circuit comprises:
   a plurality of duty cycle incremental adjust circuits associated with the plurality of incremental high signals, wherein each duty cycle incremental adjust circuit comprises a plurality of NAND gates.

5. The circuit of claim 4, wherein each plurality of NAND gates of the plurality of duty cycle incremental adjust circuits comprise:
   a first NAND gate having first and second inputs and an output, wherein the first input of the first NAND gate is coupled to the output of an associated memory element of the first programmable logic circuit and the input of the associated inverter of the first programmable logic circuit, and wherein the second input of the first NAND gate to couple to the CLK IN;
   a second NAND gate having first and second inputs and an output, wherein the first input of the second NAND gate is to coupled to a power source $V_{cc}$, and wherein the second input of the second NAND gate is coupled to the output of the first NAND gate; and a third NAND gate having first and second inputs and an output, wherein the first input of the third NAND gate is coupled to the output of the associated inverter of the first programmable logic circuit, wherein the second input of the third NAND gate is coupled to the output of the second NAND gate, and wherein the output of the third NAND gate is coupled to a first input of a second NAND gate of a subsequent duty cycle incremental adjust circuit.

6. The circuit of claim 5, wherein each duty cycle incremental adjust circuit of the positive variable duty cycle adjust circuit further comprises:

a capacitor coupled to each plurality of NAND gates of duty cycle incremental adjust circuit such that one end of the capacitor is coupled between an output of the second NAND gate and the second input of the third NAND gate and the other end of the capacitor to couple to ground (GND).

7. The circuit of claim 4, wherein the negative variable duty cycle adjust circuit comprises:

a plurality of associated duty cycle decremental adjust circuits associated with the plurality of decremental high signals, wherein each associated duty cycle decremental adjust circuit comprises a plurality of NAND gates.

8. The circuit of claim 7, wherein each plurality of NAND gates of the plurality of the negative variable duty cycle adjust circuit comprise:

a first NAND gate having first and second inputs and an output, wherein the first input of the first NAND gate to couple to the CLK IN, and wherein the second input of the first NAND gate is coupled to the output of the associated memory element of the first programmable logic circuit and the input of the associated inverter of the first programmable logic circuit;

a second NAND gate having first and second inputs and an output, wherein the first input of the second NAND gate is coupled to the output of the first NAND gate, and wherein the second input of the second NAND gate is to couple to the power source $V_{cc}$; and a third NAND gate having first and second inputs and an output, wherein the first input of the third NAND gate is coupled to the output of the second NAND gate, wherein the second input of the second NAND gate is coupled to the output of the associated inverter of the first programmable logic circuit, and wherein the output of the third NAND gate is coupled to a second input of a second NAND gate of a subsequent associated duty cycle decremental adjust circuit.

9. The circuit of claim 8, wherein the negative variable duty cycle adjust circuit further comprises:

a plurality of capacitors, wherein each capacitor is connected to each of the associated duty cycle decremental adjust circuits such that one end of the capacitor is coupled between the output of the third NAND gate and the second input of the second NAND gate of the subsequent duty cycle decremental adjust circuit, and the other end of the capacitor is to couple to GND.

10. The circuit of claim 8, wherein the second programmable logic circuit comprises:

a memory element having an input and an output, wherein the input of the memory element to couple to receive the second control signal; and an inverter coupled to the memory element of the second programmable logic circuit, wherein the inverter of the second programmable logic circuit has an input and an output, wherein the input of the inverter of the second programmable logic circuit is coupled to the output of the memory element of the second programmable logic circuit, wherein the inverter to output the incremented high logic signal or the decremented high logic signal as a function of the second control signal.

11. The circuit of claim 10, wherein the output module comprises:

a duty cycle incremental select circuit, wherein the duty cycle incremental select circuit comprises a plurality of NAND gates coupled to the output of the inverter of the second programmable logic circuit, the positive variable duty cycle adjust circuit, and the output module; and an associated duty cycle decremental adjust circuit, wherein the associated duty cycle decremental adjust circuit comprises a plurality of NAND gates coupled to the output of the inverter of the second programmable logic circuit, the negative variable duty cycle adjust circuit, and the output module.

12. The circuit of claim 11, wherein the plurality of NAND gates of the duty cycle incremental select circuit of the output module comprises:

a first NAND gate having first and second inputs and an output, wherein the first input of the first NAND gate is coupled to the input of the inverter and the output of the memory element of the second programmable logic circuit and wherein the second input to couple to the CLK IN;

a second NAND gate having first and second inputs and an output, wherein the first input of the second NAND gate is coupled to the output of a third NAND gate of a precedent duty cycle incremental select circuit and wherein the second input of the second NAND gate is coupled to the output of the first NAND gate; and a third NAND gate having first and second inputs and an output, wherein the first input of the third NAND gate is coupled to the output of the inverter of the second programmable logic circuit, and the second input of the third NAND gate is coupled to the output of the second NAND gate.

13. The circuit of claim 12, wherein the duty cycle incremental select circuit of the second programmable logic circuit further comprises:

a capacitor coupled between the output of the second NAND gate and the second input of the third NAND gate of the output module.

14. The circuit of claim 12, wherein the plurality of NAND gates of the associated duty cycle decremental adjust circuit of the output module comprises:

a first NAND gate having first and second inputs and an output, wherein the first input of the NAND gate to couple to the CLK IN and wherein the second input of the first NAND gate is coupled to the output of the memory element and the input of the inverter of the second programmable logic circuit;

a second NAND gate having first and second inputs and an output, wherein the first input of the second NAND gate is coupled to the output of the first NAND gate, and wherein the second input of the second NAND gate is coupled to output of a third NAND gate of a precedent plurality of NAND gates of the duty cycle decremental select circuit; and a third NAND gate having first and second inputs and an output, wherein the first input of the third NAND gate is coupled to the output of the second NAND gate, and wherein the second input of the third NAND gate is coupled to the output of the inverter of the second programmable logic circuit.

15. The circuit of claim 14, wherein the associated duty cycle decremental adjust circuit of the output module comprises:
    a capacitor coupled between the output of the third NAND gate and the output module.

16. The circuit of claim 15, wherein the output module further comprises:
    a NAND gate having first and second inputs and an output, wherein the first input of the NAND gate of the output module is coupled to the output of the third NAND gate of the duty cycle incremental select circuit of the second programmable logic circuit, wherein the second input of the NAND gate of the output module is coupled to the output of the third NAND gate of the associated duty cycle decremental adjust circuit of the second programmable logic circuit, and wherein the output of the NAND gate of the output module to couple to the CLK OUT.

17. A circuit comprising:
    a first edge-triggered circuit to output a plurality of variable incremental or decremental high logic signals to increment separations between a raising edge and a falling edge of an input clock signal or to decrement separations between the raising edge and the falling edge of the input clock signal in accordance with a set of first control signals;
    a second edge-triggered circuit to output an incremented high logic signal or to output a decremented high logic signal in accordance with a second control signal;
    a positive variable duty cycle adjust circuit to couple to an input clock terminal (CLK IN) to receive the input clock signal and the incremental high logic signals and to output an incremented duty cycle adjusted clock signal, the clock signal having one of a plurality of predetermined incremental separations between the raising edge and the falling edge of the input clock signal as a function of the plurality of variable incremental high logic signals;
    a negative variable duty cycle adjust circuit to couple to the CLK IN to receive the input clock signal and the decremental high logic signals and to output a decremented duty cycle adjusted clock signal, the clock signal having one of a plurality of predetermined decremental separations between the raising edge and the falling edge of the input clock signal as a function of the plurality of variable decremental high logic signals; and
    an output module to receive the incremented and decremented high logic signals and the incremented and decremented duty cycle adjusted clock signals, and to couple to an output clock terminal (CLK OUT) to output the incremented duty cycle adjusted clock signal or the decremented duty cycle adjusted clock signal as a function of the incremented high logic signal or the decremented high logic signal, respectively.

18. The circuit of claim 17, further comprising;
    an oscillator coupled to the CLK IN to generate the input clock signal having the high logic signal and a low logic signal in a clock cycle.

19. The circuit of claim 17, wherein the first edge-triggered circuit comprises:
    a plurality of registers associated with the incremental and decremental high logic signals, wherein each register has an input and an output, each input to couple to receive an associated first control signal from the set of first control signals; and
    a plurality of inverters, wherein each inverter has an input and an output, wherein the input of each inverter is coupled to the output of an associated register, wherein the output of the inverter is coupled to the positive and negative variable duty cycle adjust circuits.

20. The circuit of claim 19, wherein the plurality of registers comprises a plurality of flip-flop circuits, wherein each flip-flop circuit to store the associated first control signal, the associated first control signals corresponding to a programmed instruction.

21. The circuit of claim 17, wherein the positive variable duty cycle adjust circuit comprises:
    a plurality of multiple NAND gates to increase separation between the raising and falling edges, wherein each multiple NAND gates comprise:
        a first NAND gate having first and second inputs and an output, wherein the first input of the first NAND gate is coupled to the output of the associated register of the first edge-triggered circuit and the input of the associated inverter of the first edge-triggered circuit, and wherein the second input of the first NAND gate to couple to the CLK IN;
        a second NAND gate having first and second inputs and an output, wherein the first input of the second NAND gate is coupled to the CLK IN is to coupled to a power source $V_{cc}$, and wherein the second input of the second NAND gate is coupled to the output of the first NAND gate; and
        a third NAND gate having first and second inputs and an output, wherein the first input of the third NAND gate is coupled to the output of the associated inverter of the first edge-triggered circuit, wherein the second input is coupled to the output of the second NAND gate, and wherein the output of the third NAND gate is coupled to a first input of a second NAND gate of a subsequent multiple NAND gates.

22. The circuit of claim 21, wherein the positive variable duty cycle adjust circuit further comprises:
    a plurality of capacitors, wherein each capacitor is connected to each multiple NAND gates of the positive variable duty cycle adjust circuit such that one end of the capacitor is coupled between an output of the second NAND gate and the second input of the third NAND gate of the multiple NAND gates and the other end of the capacitor to couple to ground (GND).

23. The circuit of claim 17, wherein the negative variable duty cycle adjust circuit comprises:
    a plurality of associated multiple NAND gates, wherein each of the multiple NAND gates comprises:
        a first NAND gate having first and second inputs and an output, wherein the first input of the first NAND gate to couple to the CLK IN, and wherein the second input of the first NAND gate is coupled to the output of the associated register of the first edge-triggered circuit and the input of the associated inverter of the first edge-triggered circuit;
        a second NAND gate having first and second inputs and an output, wherein the first input of the second NAND gate is coupled to output of the first NAND gate, and wherein the second input of the second NAND gate is to couple to the power source $V_{cc}$; and
        a third NAND gate having first and second inputs and an output, wherein the first input of the third NAND gate is coupled to the output of the second NAND gate, wherein the second input of the second NAND gate is coupled to the output of the associated inverter of the first edge-triggered circuit, and wherein the output of the third NAND gate is coupled to a second input of a second NAND gate of a subsequent multiple NAND gates of the plurality of multiple NAND gates.

24. The circuit of claim 23, wherein the negative variable duty cycle adjust circuit further comprises:
a plurality of capacitors, wherein each capacitor is connected to each of the multiple NAND gates of the negative variable duty cycle adjust circuit such that one end of the capacitor is coupled between an output of the third NAND gate and the second input of the second NAND gate of the subsequent multiple NAND gates, and the other end of the capacitor is to couple to GND.

25. The circuit of claim 17, wherein the second edge-triggered circuit comprises:
a register having an input and an output, wherein the input of the register to couple to receive the second control signal based on a desired incremented high signal or a decremented low signal; and
an inverter coupled to the register of the second edge-triggered circuit, wherein the inverter of the second edge-triggered circuit has an input and an output, wherein the input of the inverter of the second edge-triggered circuit is coupled to the out put of the register of the second edge-triggered circuit, wherein the output of the inverter to output the incremented high logic signal or the decremented high logic signal as a function of the second control signal.

26. The circuit of claim 25, wherein the output module comprises:
first multiple NAND gates to coupled to the output of the inverter of the second edge-triggered circuit, the positive variable duty cycle adjust circuit, and the output module;
second multiple NAND gates coupled to the output of the inverter of the second edge-triggered circuit, the negative variable duty cycle adjust circuit, and the output module; and
an adjusted clock signal NAND gate having first and second inputs and an output, wherein the output of the adjusted clock signal NAND gate is to couple to CLK OUT to provide one of the plurality of adjusted clock signals.

27. The circuit of claim 26, wherein the first multiple NAND gates of the output module further comprises:
a first NAND gate having first and second inputs and an output, wherein the first input of the first NAND gate is coupled to the input of the inverter and the output of the register of the second edge-triggered circuit and wherein the second input to couple to the CLK IN;
a second NAND gate having first and second inputs and an output, wherein the first input of the second NAND gate is coupled to the output of the third NAND gate of the precedent first multiple NAND gates and wherein the second input of the second NAND gate is coupled to the output of the first NAND gate; and
a third NAND gate having first and second inputs and an output, wherein the first input of the third NAND gate is coupled to the output of the inverter of the second edge-triggered circuit, the second input of the third NAND gate is coupled to the output of the second NAND gate, and wherein the output of the third NAND gate is coupled to the first input of the adjusted clock signal NAND gate.

28. The circuit of claim 27, wherein the first multiple NAND gates of the output module further comprises:
a capacitor coupled between the output of the second NAND gate and the second input of the third NAND gate.

29. The circuit of claim 27, wherein the second multiple NAND gates of the output module comprises:
a first NAND gate having first and second inputs and an output, wherein the first input of the first NAND gate to couple to the CLK IN and wherein the second input of the first NAND gate is coupled to the output of the register and the input of the inverter of the second edge-triggered circuit;
a second NAND gate having first and second inputs and an output, wherein the first input of the second NAND gate is coupled to the output of the first NAND gate, wherein the second input of the second NAND gate is coupled to output of a third NAND gate of a precedent second multiple NAND gates; and
a third NAND gate having first and second inputs and an output, wherein the first input of the third NAND gate is coupled to the output of the second NAND gate, wherein the second input of the third NAND gate is coupled to the output of the inverter of the second edge-triggered circuit, and wherein the output of the third NAND gate is coupled to the second input of the adjusted clock signal NAND gate.

30. The circuit of claim 29, wherein the second multiple NAND gates of the output module further comprises:
a capacitor coupled between the output of the third NAND gate and the second input of the adjusted clock signal NAND gate.

31. A method of adjusting duty cycle of an input clock signal in an integrated circuit, comprising:
inputting a first programmed instruction for selecting one of a plurality of incremented or decremented separations between a raising edge and a falling edge of a clock signal into the integrated circuit device;
generating a set of first control signals as a function of the first programmed instruction;
generating one of a plurality of incremented or decremented duty cycle adjusted clock signals by incrementing or decrementing a separation between the raising edge and the falling edge of the input clock signal as a function of the first control signals;
inputting a second programmed instruction for selecting to output the generated one of the plurality of incremented or decremented duty cycle adjusted clock signals;
generating a second set of control signals as a function of the second programmed instruction;
selecting the generated one of the plurality of incremented or decremented duty cycle adjusted clock signals as a function of the second control signals; and
outputting the selected one of the plurality of incremented or decremented duty cycle adjusted clock signals.

32. The method of claim 31, further comprising:
multiplexing the outputted incremented or decremented duty cycle adjusted clock signal.

33. The method of claim 31, wherein the input clock signal is a logic signal of a pulse type waveform that switches from low to high and then from high to low with a fixed repetition pattern in time.

34. The method of claim 33, wherein the pulse type waveform comprises high and low signals in each clock cycle.

35. The method of claim 31, wherein inputting the first programmed instruction for selecting one of the plurality of incrementing or decrementing separations between the raising edge and the falling edge of the input clock signal further comprises:
  storing the first and second programmed instruction in associated memory elements of the integrated circuit.

36. The method of claim 35, wherein in storing the first and second programmed instruction in memory elements, the memory elements comprise devices selected from the group consisting of registers and flip-flop circuits.

37. The method of claim 31, further comprising:
  generating the input clock signal using an oscillator, wherein the input clock signal has the raising edge and the falling edge in each clock cycle; and
  inputting the clock signal into the integrated circuit.

38. The method of claim 37, wherein in generating the input clock signal, the input clock signal comprises a 50% duty cycle.

* * * * *